United States Patent [19]
Kawasaki et al.

[11] Patent Number: 5,463,329
[45] Date of Patent: Oct. 31, 1995

[54] INPUT CIRCUIT FOR LEVEL-SHIFTING TTL OR CMOS TO ECL SIGNALS

[75] Inventors: Somei Kawasaki, Urawa; Masami Iseki, Yokohama, both of Japan

[73] Assignee: Canon Kabushiki Kaisha, Tokyo, Japan

[21] Appl. No.: 225,311

[22] Filed: Apr. 8, 1994

[30] Foreign Application Priority Data

Apr. 19, 1993 [JP] Japan .................. 5-091332

[51] Int. Cl.⁶ ............................ H03K 19/018
[52] U.S. Cl. ............................ 326/77; 326/31
[58] Field of Search ............... 307/443, 455, 307/475, 494; 326/77, 31, 93, 126

[56] References Cited

U.S. PATENT DOCUMENTS

| | | | |
|---|---|---|---|
| 4,518,876 | 5/1985 | Constantinescu | 307/475 |
| 4,700,087 | 10/1987 | Stroberger | 307/475 |
| 4,806,800 | 2/1989 | Khan | 307/494 X |
| 5,041,743 | 8/1991 | Matsumoto | 307/443 X |
| 5,075,580 | 12/1991 | Dayton et al. | 307/455 X |
| 5,349,253 | 9/1994 | Ngo et al. | 307/475 |

*Primary Examiner*—David R. Hudspeth
*Attorney, Agent, or Firm*—Fitzpatrick, Cella, Harper & Scinto

[57] ABSTRACT

An input circuit which converts an input signal to an output signal. A first level comparator has a first input to which the input signal is applied and a second input to which a first reference voltage is applied for comparison with the input signal, and an output which the output signal is manifested. A second level comparator has a first input connected to the first input of the first level comparator for application one input signal, and a second input to which a second reference voltage is applied for comparison with the input signal, with the second level comparator limiting the voltage at the first input of the first level comparator to substantially the second reference voltage whenever the input signal exceeds the second reference voltage as determined by the second level comparator.

8 Claims, 8 Drawing Sheets

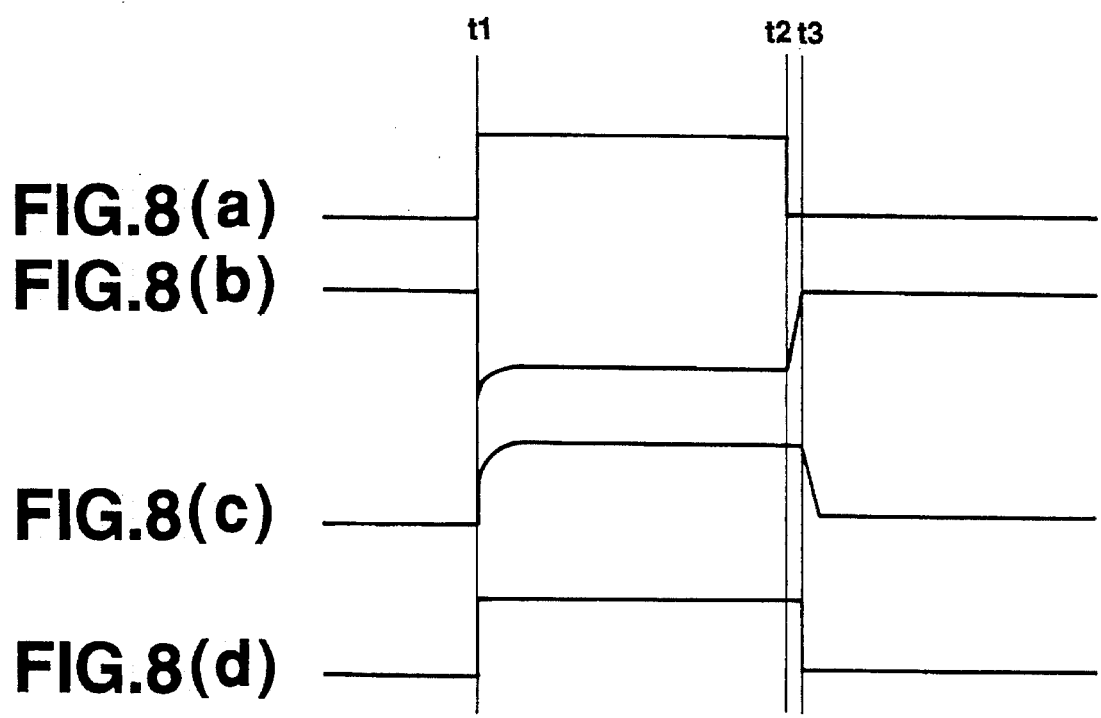

INPUT CIRCUIT FOR LEVEL-SHIFTING TTL OR CMOS TO ECL SIGNALS

BACKGROUND OF THE INVENTION

1. Field of the Invention

This invention relates to an input circuit (IC) used, for example, when converting a TTL-level or CMOS-level input signal into an ECL-level signal.

2. Description of the Related Art

FIG. 2 illustrates a circuit (IC) for converting a TTL-level or CMOS-level input signal into an ECL-level signal.

A signal from an output driver of a CMOS circuit or a TTL circuit is input to input terminal 2, and is supplied to the base of transistor Q3 via resistor R4. A reference voltage $V_R$ is input to the base of transistor Q3 via a low impedance voltage follower 1 and resistor R3. The value of reference voltage $V_R$ is reduced by a predetermined voltage value by resistor R7 and constant-current source $I_1$, and the resultant voltage at the common connection of R7 and $I_1$ is applied to the base of transistor Q4.

The emitters of transistors Q3 and Q4 are connected together and to constant-current source I3. The collector of transistor Q3 and the collector of transistor Q4 are connected to power supply terminal $V_{cc}$ via resistors R5 and R6, respectively, and are labelled as negative-phase output terminal $\bar{Q}$ and positive-phase output terminal Q, respectively.

FIG. 4 is a terminal-voltage diagram illustrating input signals at input terminal 2 and changes in the voltage at the base of transistor Q3 in accordance with the input signals. In FIG. 4, (a) illustrates the voltage range of an input signal from a CMOS circuit. If the power supply voltage $V_{cc}$ is assumed to be 5V, the (High) H level is guaranteed to be in the range of 4–5V, and the (Low) L level is guaranteed to be in the range of 0–1V.

In FIG. 4, (c) illustrates the voltage range of an input signal from a TTL circuit. The H level is guaranteed to be in the range of 2–3.5V, and the L level is guaranteed to be in the range of 0.2–0.4V.

In a level comparator comprising transistors Q3 and Q4, the base voltage of transistor Q3 must be maintained at least at ±4 VT (VT equals kT/g, where k is the Boltzmann constant, T is the absolute temperature, and q is the electric charge of an electron) compared with the base voltage of transistor Q4, serving as a reference voltage, for any H-level and L-level input conditions. In consideration of high-temperature operations, at least ±150 mv must be maintained. That is, it is necessary that when the CMOS level equals 1V (at the maximum value of the L level), the base voltage of transistor Q3—the base voltage of transistor Q4<–0.15V, and when the TTL level equals 2V (at the minimum value of the H level), the base voltage of transistor Q3—the base voltage of transistor Q4>0.15V.

If, for example, the reference voltage $V_4$ is set to 2.9 V, and the value of R4/R3 is set to 2, the base voltage of transistor Q3 for CMOS and TTL input levels is converted into values shown in FIG. 4 at (b) and (d), respectively. In this case, the base voltage of transistor Q3 is about 2.27V when the CMOS level equals 1V, and is 2.6V when the TTL level equals 2V. Since the difference between the two values exceeds 0.3V, the above-described conditions are satisfied. If the values of resistor R7 and constant current source I1 are set so that the base voltage of transistor Q4 is about 2.435V (that is, $V_R$ (=2.9)–I1×R7=2.435V), the input circuit shown in FIG. 2 outputs input signals from the CMOS circuit and the TTL circuit to positive-phase output terminal Q and negative-phase output terminal $\bar{Q}$ as differential ECL signals. The base voltage of transistor Q3 becomes 2.4V at an ordinary threshold level 1.4V of a TTL signal. Since this value is very close to the threshold level of the input circuit shown in FIG. 2, this case has desirable characteristics.

The conventional input circuit shown in FIG. 2, however, has problems particularly due to a parasitic capacitance $C_x$ present, for example, in constant current source I3. The problems will be discussed below with reference to FIGS. 3(a)–3(d).

FIG. 3(a) illustrates the waveform of the signal input to input terminal 2 and the base of transistor Q3. FIGS. 3(b) and 3(c) illustrate negative-phase and positive-phase ECL output signals from the collector of transistor Q3 and the collector of transistor Q4, respectively.

The emitter voltage of transistors Q3 and Q4 is $V_R$–R7·I1–$V_f$ ($V_f$ is the base-emitter drop voltage when the transistor is turned on) before time $t_1$, and the discharging operation of parasitic capacitance $C_x$ has been completed.

When the input signal has changed from the L level to the H level at time $t_1$, the base-emitter voltage of transistor Q3 has a large value instantaneously. Hence, as shown in FIG. 3(b), a negative overshoot is generated at the collector of transistor Q3. On the other hand, transistor Q4 is not immediately turned off at time $t_1$, and the collector voltage of transistor Q4 gradually increases as the parasitic capacity $C_x$ is charged. When the H level of the input signal equals 5V, parasitic capacity $C_x$ is charged until the emitter voltage of transistor Q3 becomes 3.6–$V_f$.

Since the input signal changes from the H level to the L level at time $t_2$, transistor Q3 is turned off, and the collector voltage of transistor Q3 changes from the L level to the H level (FIG. 3(b)). However, transistor Q4 is not turned on until the discharging operation of parasitic capacity $C_x$ by constant current source I3 is completed. Hence, the collector voltage of transistor Q4 changes to the L level at a time $t_3$, at which time the discharging operation has been completed (FIG. 3(c)). This discharging operation continues until the emitter voltage of transistor Q4 becomes $V_R$–R7·I1–$V_f$.

In the above-described differential ECL output signals, when the input signal changes from the H level to the L level, a period of time (from $t_2$ to $t_3$) exists during which the logic level of each of the signals Q and $\bar{Q}$ assumes the H level. During this period, as shown in FIG. 3(d), a noise pulse may be generated or the pulse duty ratio may be deteriorated in the ECL circuit of the following stage. Particularly when the input signal is a clock signal, fatal problems will, in many cases, occur. In order to overcome such problems, a circuit having a time constant has conventionally been used for suppressing the generation of the noise pulse, thereby causing a decrease in the permissible highest value of the frequency of the input signal.

SUMMARY OF THE INVENTION

It is an object of the present invention to provide an input circuit which does not generate a noise pulse without reducing the highest permissible value of the frequency of an input signal.

According to one aspect, the present invention which achieves the above-described object relates to an input circuit for converting a CMOS-level or TTL-level input signal into differential ECL signals, comprising a first level comparator which attenuates the input signal, and a second level comparator for limiting the maximum voltage of a comparison terminal of the first level comparator to a voltage having a value of at least the minimum value of the TTL H level.

It is another object of the present invention to provide a conversion circuit which can convert the level of an input signal at a high speed without generating noise or the like even if the level of the input signal is uneven in a predetermined range.

It is still another object of the present invention to provide an integrated circuit (IC) which includes the above-described input circuit or conversion circuit.

These and other objects, advantages and features of the present invention will become more apparent from the following detailed description of the preferred embodiments taken in conjuction with the accompanying drawings.

BRIEF DESCRIPTION OF THE DRAWINGS

FIGS. 8(a)–8(d) comprise an operational time chart of the input circuit of FIG. 1.

DETAILED DESCRIPTION OF THE PREFERRED EMBODIMENTS

Preferred embodiments of the present invention will now be described with reference to the drawings.

First Embodiment

Figure 1:
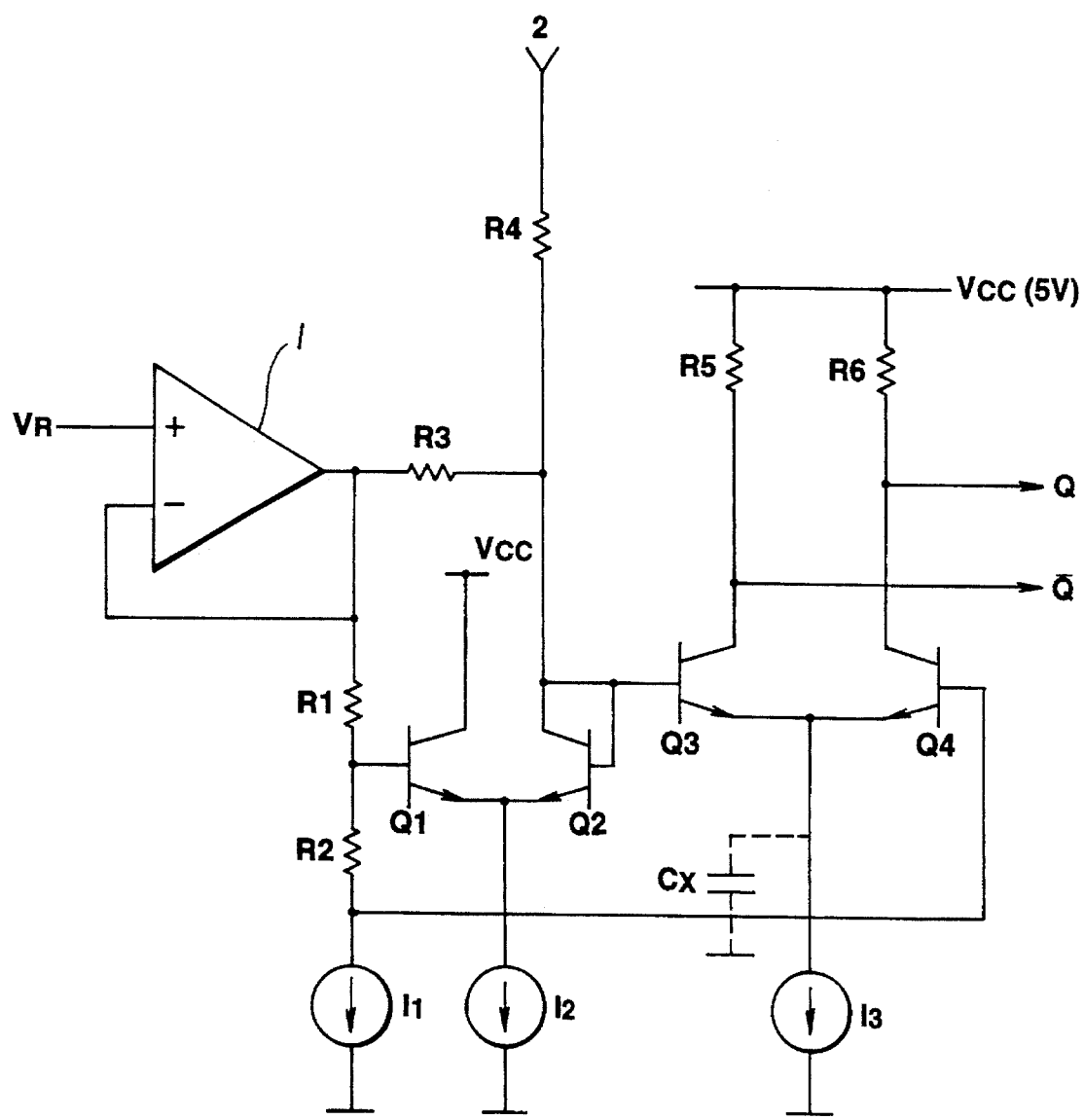
FIG. 1 is a diagram illustrating an input circuit according to an embodiment of the present invention.

FIG. 1 is an input circuit (IC) according to a first embodiment of the present invention.

Figure 2:
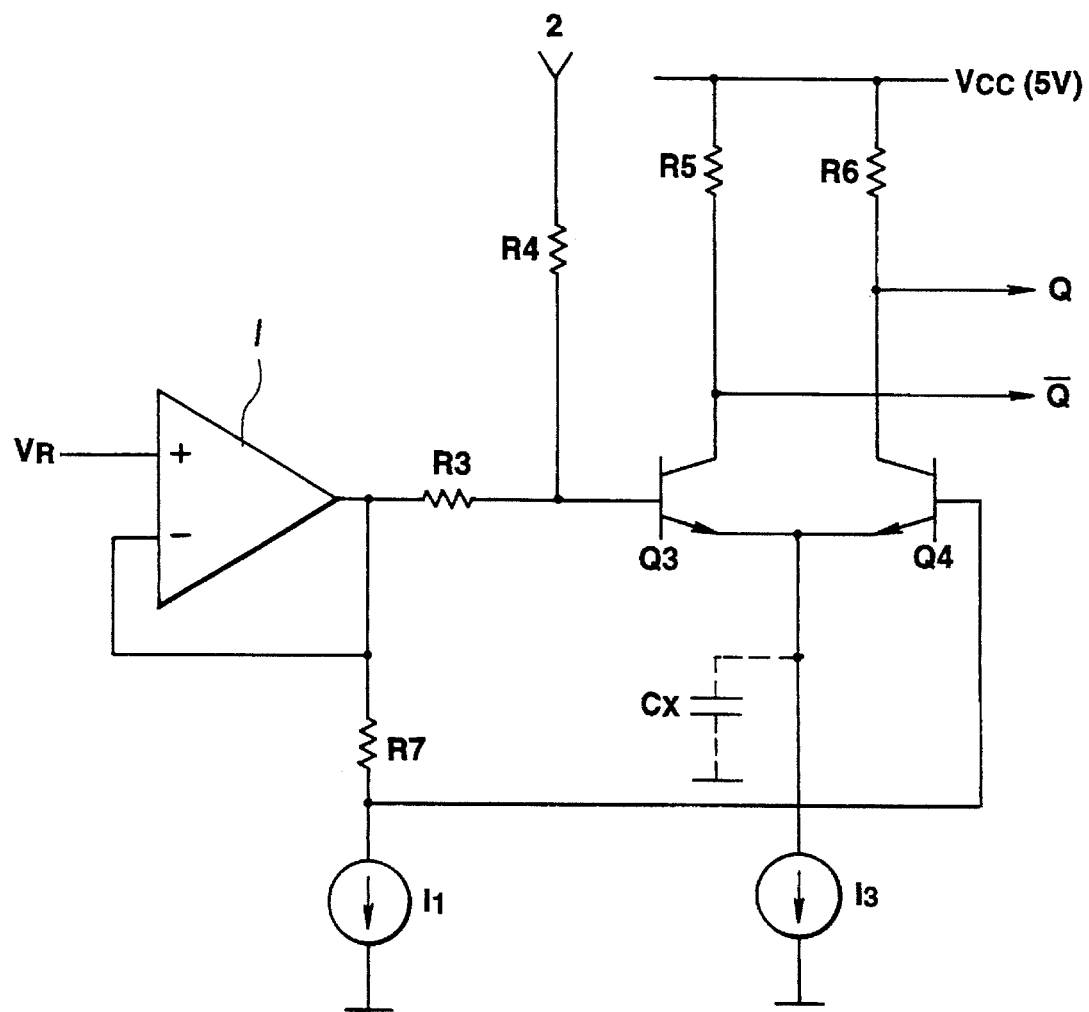
FIG. 2 is a diagram illustrating a conventional input circuit.

In FIG. 1, components operating in the same manner as the corresponding components in the conventional circuit shown in FIG. 2 are indicated by the same reference numerals. Differences between the circuits shown in FIGS. 1 and 2 will now be described.

An attenuated signal is input to the base of transistor Q3 and is also supplied to a common connection of the collector and base of transistor Q2. The value of reference voltage $V_R$ applied to voltage follower 1 is reduced by a predetermined voltage value determined by resistors R1 and R2 and constant current source I1, and the resultant voltage at the common connection of R1 and R2 is applied to the base of transistor Q1. The collector of transistor Q1 is connected to power supply $V_{cc}$, the emitter of transistor Q1 is connected in common with the emitter of transistor Q2 and constant current source I2. The value of the voltage at the common connection of R2 and constant current source I1 is applied to the base of transistor Q4. It is assumed that R1+R2=R7, where R7 is a resistor in FIG. 2, as previously explained.

Figure 7:
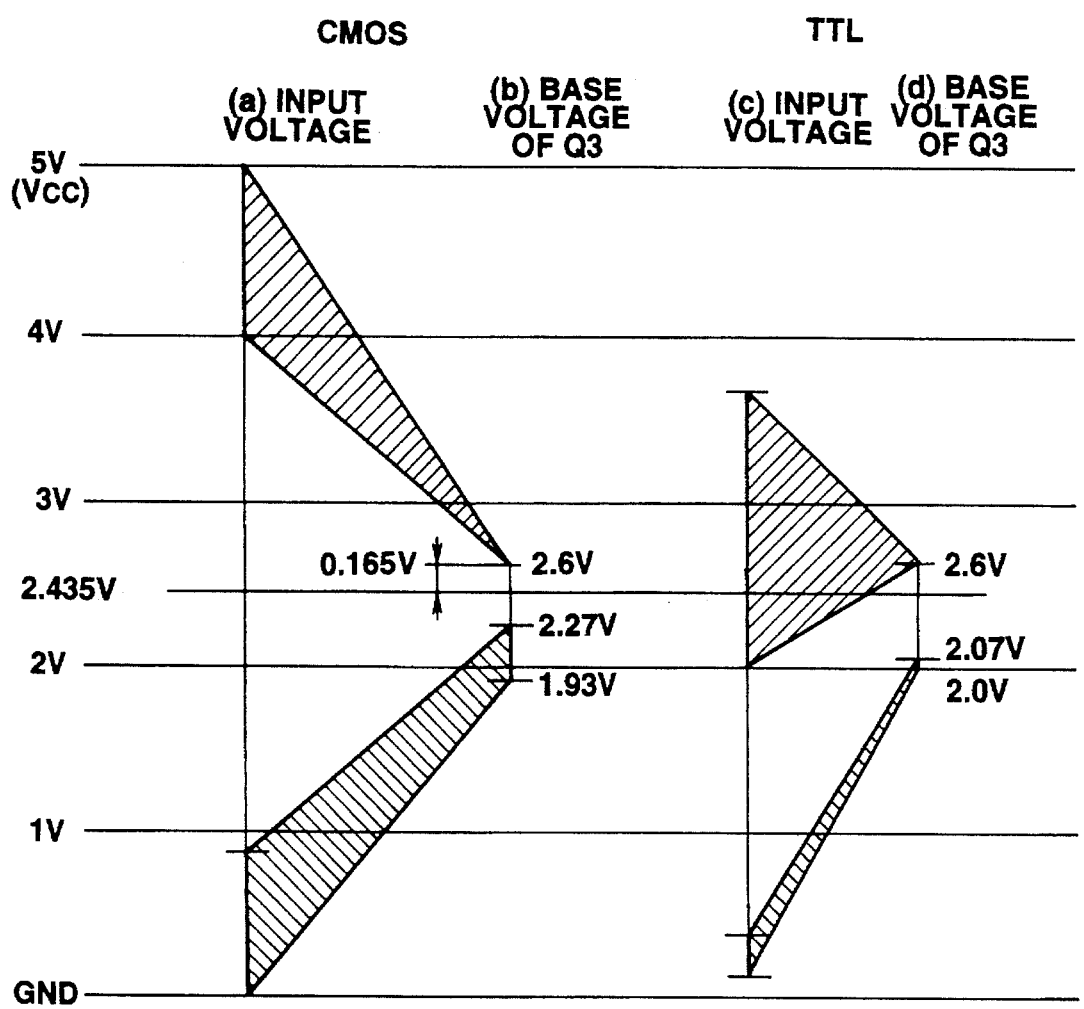
FIG. 7 is a diagram illustrating conversion of input logic voltages according to the present invention.

Suppose that the base voltage of transistor Q1 is set to the minimum value of the TTL H level voltage 2.6V (that is, $V_R$ (=2.9V)–I1×RI=2.6V). If the voltage at the common connection of the bases of transistors Q2 and Q3 becomes greater than 2.6V, transistor Q2 is turned on, and a maximum current I2 flows in resistors R4 and R3 as a sink current to suppress an increase in the base voltage of transistor Q3. If constant current source I2 is set to a value exceeding the value ($V_{cc}$ (5V)–2.6V)/R4+(VR (2.9V)–2.6V/R3, the base voltage of transistor Q3 does not exceed 2.6V irrespective of the input signal level applied to terminal 2 (see FIG. 7).

Waveforms of signals present in FIG. 1 are illustrated in FIGS. 8(a)–8(d). These waveforms are generated at points in FIG. 1 which correspond to points in the conventional circuit of FIG. 2, at which waveforms are generated as shown in FIGS. 3(a)–3(d).

Figure 3:
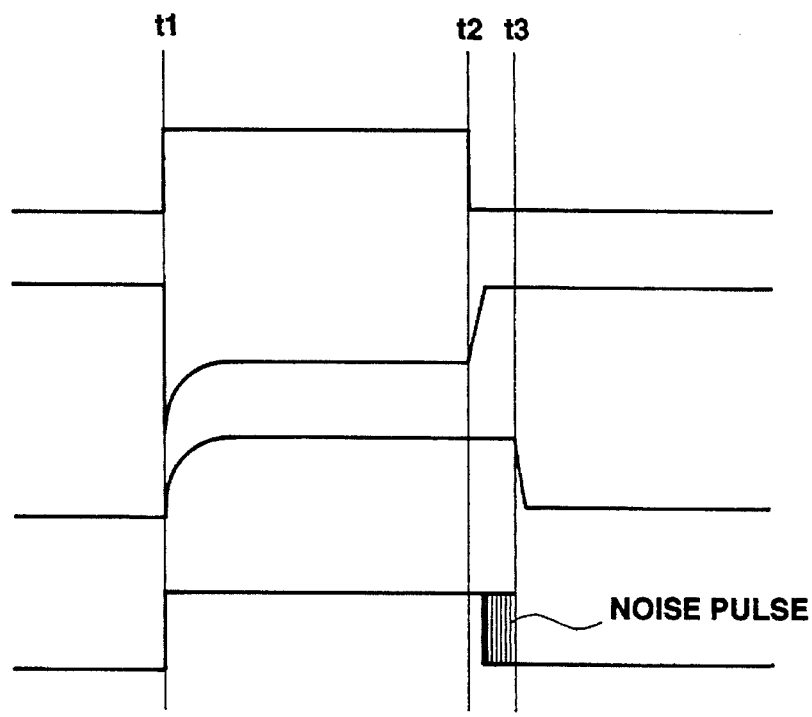
FIGS. 3(a)–3(d) comprise an operational time chart of the conventional input circuit of FIG. 2.
Figure 4:
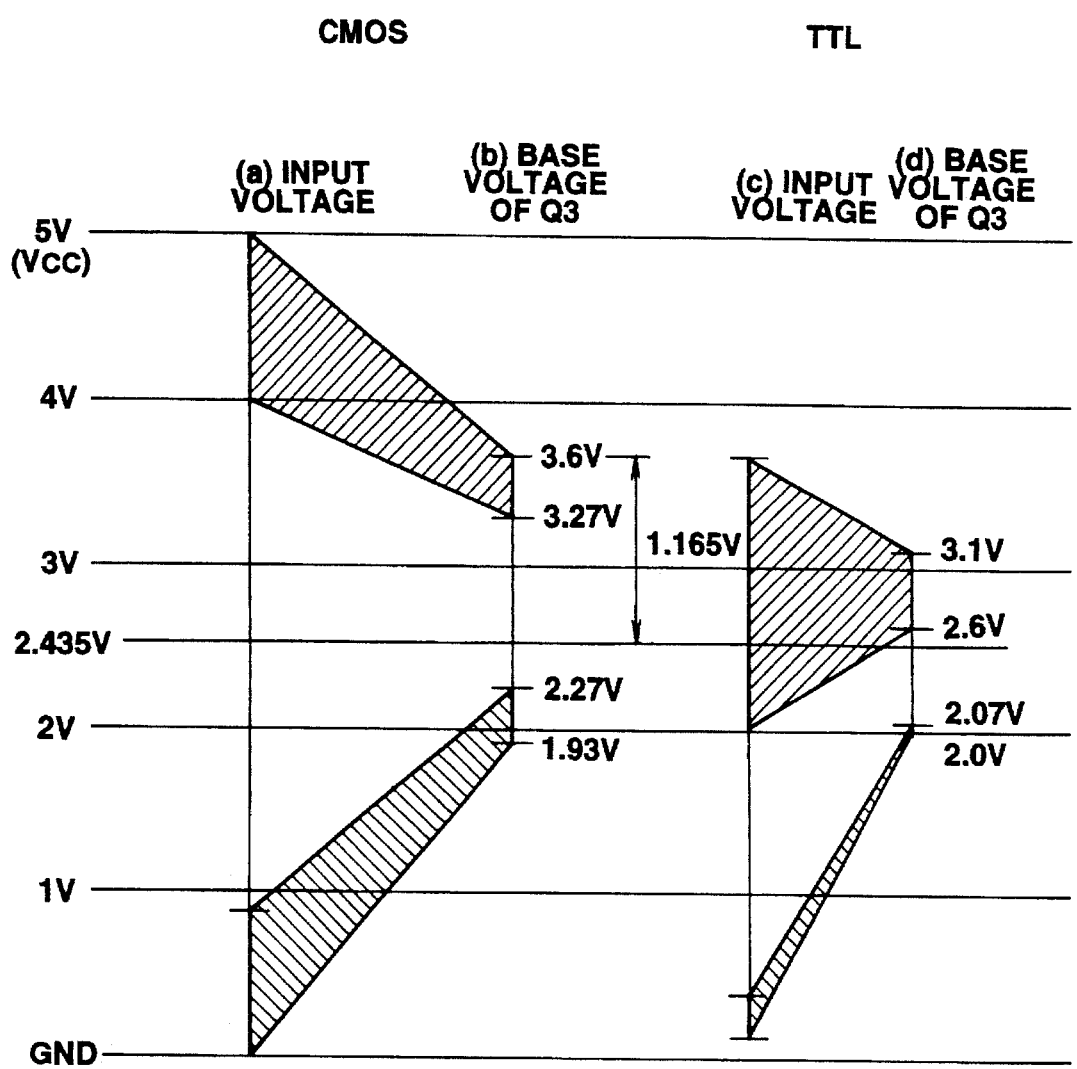
FIG. 4 is a diagram illustrating conversion of input logic voltages.

In the conventional circuit of FIG. 2, when the input signal (FIG. 3(a)) changes from a H level to a L level at time $t_2$, the constant current I3 discharges the voltage stored in parasitic capacitance $C_x$ by an amount corresponding to a significant change in potential at the emitter of transistor Q3, which turns transistor Q3 off. Thus, it takes a significant amount of time to turn off transistor Q3 (FIG. 3(c)), after transistor Q4 has turned on.

In the circuit of FIG. 1, when the input signal (FIG. 8(a)) changes from a H level to a L level, the potential at the emitter of transistor Q3 is at most 0.165V (=(2.6V Vf)–(2.435V - Vf)), which is significantly reduced in comparison with 1.165V (=(3.6V–Vf)–(2.435V–Vf)) in the conventional circuit (FIG. 2). Thus, in the circuit of FIG. 1, the voltage stored in the parasitic capacitance $C_x$ is rapidly discharged, beginning at time $t_3$, resulting in a fast turn-off of transistor Q3 (FIG. 8(c)). Thus, a noise pulse as generated in the circuit of FIG. 2 (FIG. 3(d)), is not generated in the circuit of FIG. 1, or is at least minimal in duration (FIG. 8(d)).

Of course, the base voltage of transistor Q1 is not limited to the minimum value of the TTL H level, provided that the circuit operation is satisfied.

The input circuit itself can comprise a single IC, but preferably the input circuit may comprise a single IC with another circuit having a predetermined function.

A description will now be provided of second and third embodiments of the present invention to which the input circuit of the first embodiment is connected.

Second Embodiment

Figure 5:
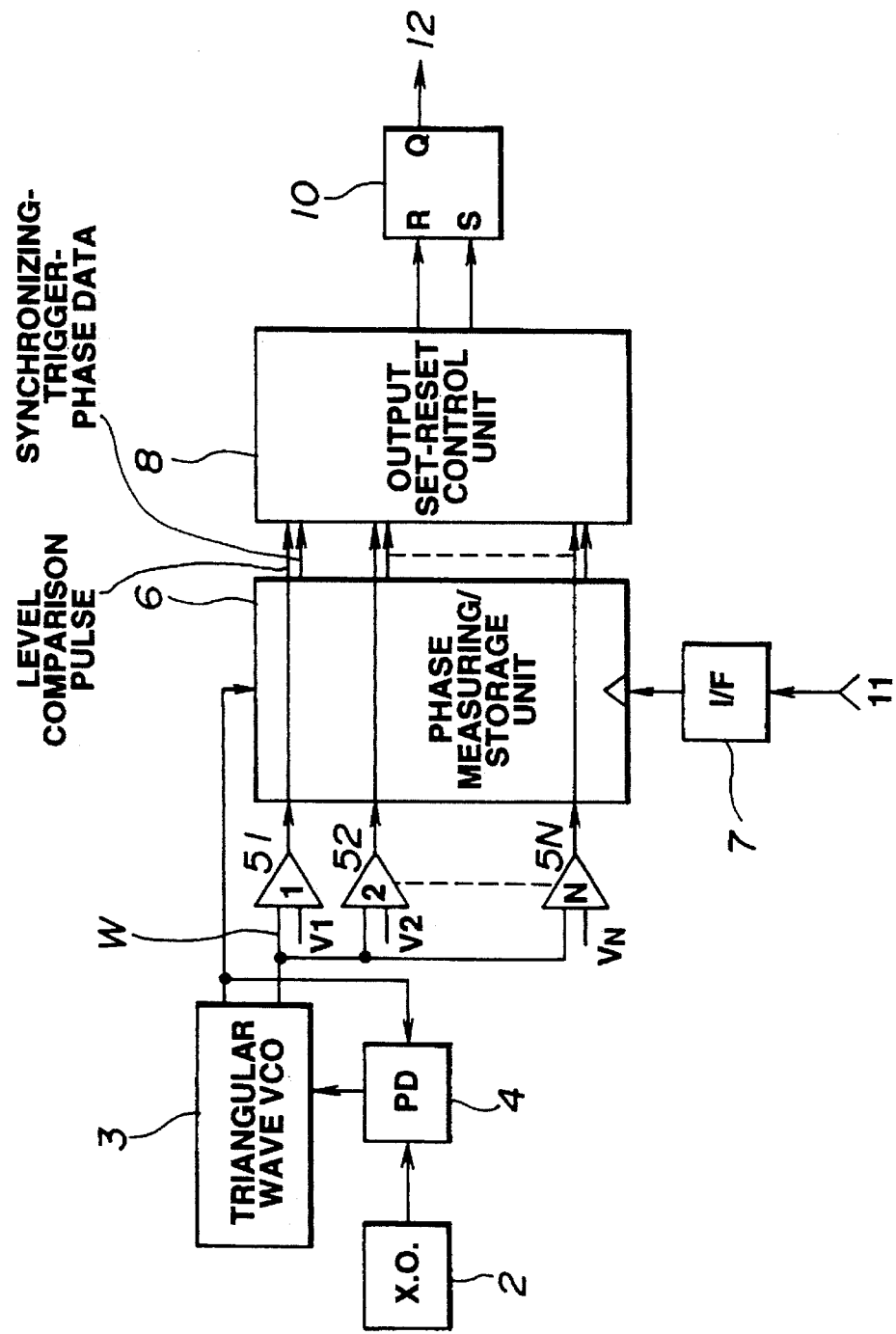
FIG. 5 is a diagram illustrating the configuration of a synchronizing-clock-signal generator to which the input circuit shown in FIG. 1 is connected.

FIG. 5 illustrates a configuration of a synchronizing-clock-signal generator which includes the IC of FIG. 1, and which is used in an LBP, an image memory or the like. The phase of a rectangular-wave signal for controlling switching between charging and discharging of triangular-wave VCO (voltage-controlled oscillator) 3 for generating a triangular-wave signal is compared with the phase of a reference clock signal output from crystal oscillator 2 by a phase comparator 4. The comparison signal from comparator 4 is used to control VCO 3. The frequency of the triangular-wave signal from triangular-wave VCO 3 thereby becomes stable. The triangular-wave signal is input to level comparators 51 - 5N to be compared with comparison voltages V1 - VN, respectively, and is input to phase measuring/storage unit 6 together with the rectangular-wave signal. By appropriately selecting comparison voltages V1 - VN with respect to the triangular-wave signal, edges of output level comparison pulses from level comparators 51 - 5N can equally divide one period of the triangular-wave signal.

A synchronizing trigger signal 11 is input to a phase measuring/storage unit 6 via input circuit 7. In the case of an LBP, the synchronizing trigger signal comprises BD (beam detection) pulses representing the lateral position of paper. In the case of an image memory, the synchronizing trigger signal is a horizontal synchronizing video signal. By latching the edge of the above-described level comparison output pulse with a predetermined edge of the synchronizing trigger signal, the phase of the synchronizing trigger signal is measured and stored in phase measuring/storage unit 6. Data relating to the phase of the synchronizing trigger signal and level comparison pulses are input to output set-reset control unit 8, and is further input to RSFF (RS flip-flop) circuit 10, whose output signal 12 is a synchronizing clock signal having the same frequency as that of the reference clock signal synchronized with the synchronizing trigger signal. In the case of an LBP, this synchronizing clock signal is a printing-pixel clock signal. In the case of an image memory, this synchronizing clock signal is a sampling clock signal. Accuracy of synchronization is determined by the number of the level comparators 51 - 5N.

Since it is desired that the frequency of the synchronizing clock signal has a value of at least 20 MHz (megahertz) and the accuracy of synchronization has a value less than 1/10 of the period of the clock signal, high-speed ECL circuits are required for phase measuring/storage unit 6, output set/reset control unit 6 and RSFF circuit 10. Accordingly, input circuit 7 must convert the CMOS level or the TTL level into the ECL level. In addition, since only one edge of the synchronizing trigger signal is used, generation of a noise pulse or generation of jitter caused by degradation of the edge must be prevented, because these factors deteriorate the picture quality both in an LBP and in an image memory. Hence, the above-described input circuit (FIG. 1) must be used as input circuit 7.

Third Embodiment

Figure 6:
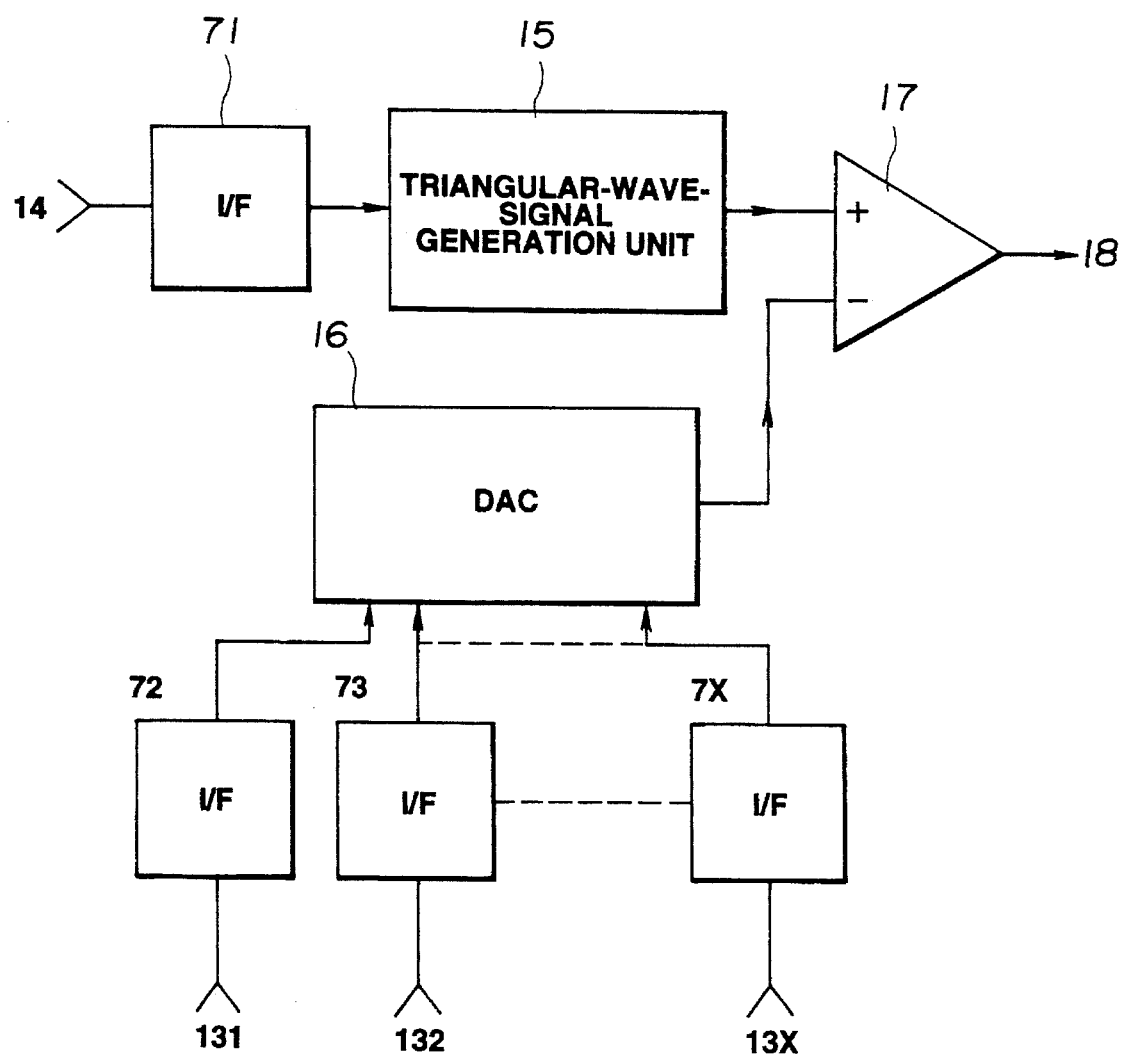
FIG. 6 is a diagram illustrating the configuration of a pixel (picture element) modulation circuit of an LBP (laser-beam printer) to which the input circuit shown in FIG. 1 is connected.

FIG. 6 illustrates a pixel modulation circuit which includes the input circuit (FIG. 1) of the invention, and which performs pulse-width modulation of a laser beam with a printing pixel in accordance with pixel information in an LBP which prints a half-tone image, such as a video image or the like. A printing-pixel clock signal, which is a synchronizing clock signal output from the synchronizing-clock-signal generator shown in FIG. 5, is input to input terminal 14, and is further input to triangular-wave-signal generation unit 15 via input circuit 71. Triangular-wavesignal generation unit 15 generates a triangular-wave signal synchronized with the input signal. The generated triangular-wave signal is input to a level comparator 17.

Pixel information is input to input terminals 131 - 13X in units of a printing-pixel clock pulse, and is further input to a D/A converter 16 via respective input circuits 72 - 7X. The output voltage of D/A converter 16 is input to level comparator 17 to be compared with the above-described triangular-wave signal generated by unit 15. Level comparator 17 generates an output signal 18 having a pulse width corresponding to the pixel information. Output signal 18 controls the amount of laser irradiation to provide gradation in a printed image. The number of bits of the image information determines the gradation of the image. In order to generate a triangular-wave signal with a low-voltage power supply (supplying, for example, a voltage of 5V), ECL circuits, each of which provides a current logic for switching charging/discharging current at a high speed, must be used.

Since D/A converter 16 must generate a level comparison voltage in units of a printing pixel as fast as possible (in order to shorten the switching time as much as possible), high-speed ECL circuits must be used. Hence, the input circuits (FIG. 1) of the present invention must be used as input circuits 71, and 72 - 7X.

As described above, there exist a large number of circuit systems which require input circuits for receiving high-speed and high-accuracy timing pulses. Hence, the input circuit of the present invention is particularly effective in IC circuits.

As described above, according to the present invention, an input circuit converts a CMOS-level or TTL-level input signal into an ECL-level signal by providing a level comparator for limiting a wide H-level range to less than a predetermined level. In this input circuit, generation of a noise pulse can be prevented without reducing the highest permissible value of the frequency of the input signal.

The individual components shown in outline or designated by blocks in the drawings are all well known in the input circuit arts and their specific construction and operation are not critical to the operation of, or the best mode for carrying out the invention.

While the present invention has been described with respect to what is presently considered to be the preferred embodiments, it is to be understood that the invention is not limited to the disclosed embodiments. To the contrary, the present invention is intended to cover various modifications and equivalent arrangements included within scope of the appended claims.

What is claimed is:

1. An input circuit for converting an input signal to an output signal, comprising:

means for providing first and second reference voltages;

a first level comparator having a first input to which the input signal is provided and a second input to which the first reference voltage is provided for comparison with the input signal, and an output at which the output signal is manifested; and a second level comparator having a first input connected to said first input of said first level comparator for receiving the input signal, and a second input to which the second reference voltage is provided for comparison with the input signal, with said second level comparator limiting the voltage at said first input of said first level comparator to substantially the second reference voltage whenever the input signal exceeds the second reference voltage.

2. An input circuit according to claim 1, wherein said first level comparator includes first and second emitter-coupled transistors, with the collector and base of said first transistor being connected together as said first input of said second level comparator, and with the base of said second transistor being said second input of said second level comparator.

3. An input circuit according to claim 1, wherein said first level comparator includes third and fourth emitter-coupled transistors, with the base of said third transistor being said first input of said first level comparator, the base of said fourth transistor being said second input of said first level comparator and the collectors of said third and fourth transistors being said output.

4. An input circuit according to claim 1, wherein the input signal is a TTL- and/or CMOS-level signal.

5. An input circuit according to claim 1, wherein said first level comparator outputs an ECL-level signal.

6. An IC (integrated circuit) which incorporates the input circuit according to claim 1.

7. An IC according to claim 6, wherein said input circuit receives a predetermined trigger signal, with said IC including means for generating a clock signal synchronized with the predetermined trigger signal.

8. An IC according to claim 6, wherein said input circuit receives image information, with said IC including means for outputting a signal subjected to pulse-width modulation in accordance with the image information.

* * * * *

UNITED STATES PATENT AND TRADEMARK OFFICE
CERTIFICATE OF CORRECTION

PATENT NO. : 5,463,329
DATED : October 31, 1995
INVENTOR(S) : SOMEI KAWASAKI, ET AL.

It is certified that error appears in the above-indentified patent and that said Letters Patent is hereby corrected as shown below:

[57] ABSTRACT

Line 5, "which" should read --at which--; and

Line 7, "one" should read --of the--.

COLUMN 1

Line 48, "±150 mv" should read --±150 mV--; and

Line 55, "voltage $V_4$" should read --voltage $V_R$--.

COLUMN 4

Line 10, "($V_{cc}$ (5V)-2.6V)/R4+(VR(2.9V)-2.6V/R3," should read --($V_{cc}$ (5V)-2.6V)/R4+($V_R$(2.9V)-2.6V)R3,--.

Signed and Sealed this

Nineteenth Day of March, 1996

*Attest:*

BRUCE LEHMAN

*Attesting Officer*  *Commissioner of Patents and Trademarks*